United States Patent [19]

Steffen

[11] Patent Number: 5,311,396
[45] Date of Patent: May 10, 1994

[54] SMART CARD CHIP-BASED ELECTRONIC CIRCUIT

[75] Inventor: Francis Steffen, St Maximin, France

[73] Assignee: SGS-Thomson Microelectronics, S.A., Gentilly, France

[21] Appl. No.: 937,438

[22] Filed: Aug. 31, 1992

Related U.S. Application Data

[63] Continuation of Ser. No. 598,063, Oct. 16, 1990, abandoned.

[30] Foreign Application Priority Data

Oct. 20, 1989 [FR] France ................... 8913755

[51] Int. Cl.$^5$ ............................. H05K 1/14
[52] U.S. Cl. ..................... 361/736; 29/840; 174/262; 257/679; 257/724; 439/68; 361/783; 361/807
[58] Field of Search ............ 228/180.2; 174/253, 174/255, 260, 261, 262, 265; 257/778, 692, 693, 694, 695, 696, 698, 723, 724, 679; 361/397, 400, 403, 404, 405, 406, 409, 412, 414, 417; 439/66, 68; 29/832, 840

[56] References Cited

U.S. PATENT DOCUMENTS

| 4,642,889 | 2/1987 | Grabbe | 361/413 |
| 4,688,150 | 8/1987 | Peterson | 361/400 |
| 4,697,858 | 10/1987 | Balakrishnan | 361/413 |
| 4,766,371 | 8/1988 | Moriya | 439/66 |
| 4,853,825 | 8/1989 | Utner | 174/52.2 |

FOREIGN PATENT DOCUMENTS

| 3231056 | 2/1984 | Fed. Rep. of Germany . |
| 3321694 | 12/1984 | Fed. Rep. of Germany ...... 361/406 |
| 2619276 | 2/1989 | France . |
| 2134338 | 8/1984 | United Kingdom . |
| 2202094 | 9/1988 | United Kingdom . |

OTHER PUBLICATIONS

IBM Disclosure Bulletin, "Mechanical Supports for Surface-Mounted Leaded and Leadless Components", vol. 29, No. 6, Nov. 1986.

Primary Examiner—Leo P. Picard
Assistant Examiner—Donald Sparks
Attorney, Agent, or Firm—Robert Groover

[57] ABSTRACT

A portable and connectable chip-based electronic system has one or more chips integrated into a package. The electronic component obtained is mounted, in a first embodiment, on the upper surface of metal contacts. A lower surface has metal contacts that constitute the connector of the system. Each of the metal contacts of the upper face is connected to and faces a metal contact of the lower surface, and vice versa. In a second embodiment, the electronic component is surface mounted on an upper surface of metal contacts, the lower surface of these contacts forming the connector. A system such as this is designed to be inserted into a reader which will get connected to the connector. Such a system may have other electronic components that are mutually interconnected and interconnected with the electronic component.

34 Claims, 3 Drawing Sheets

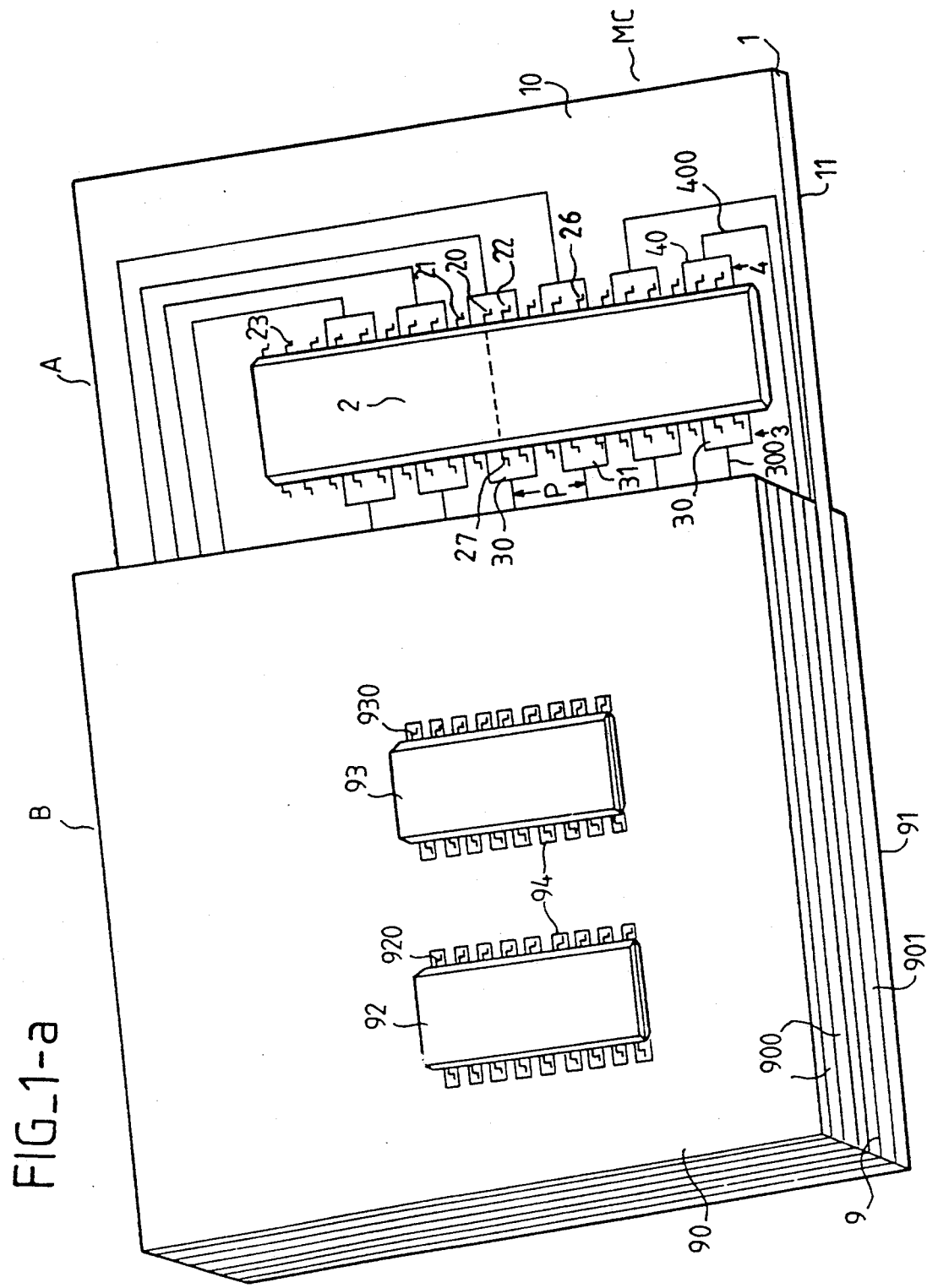
FIG_1-a

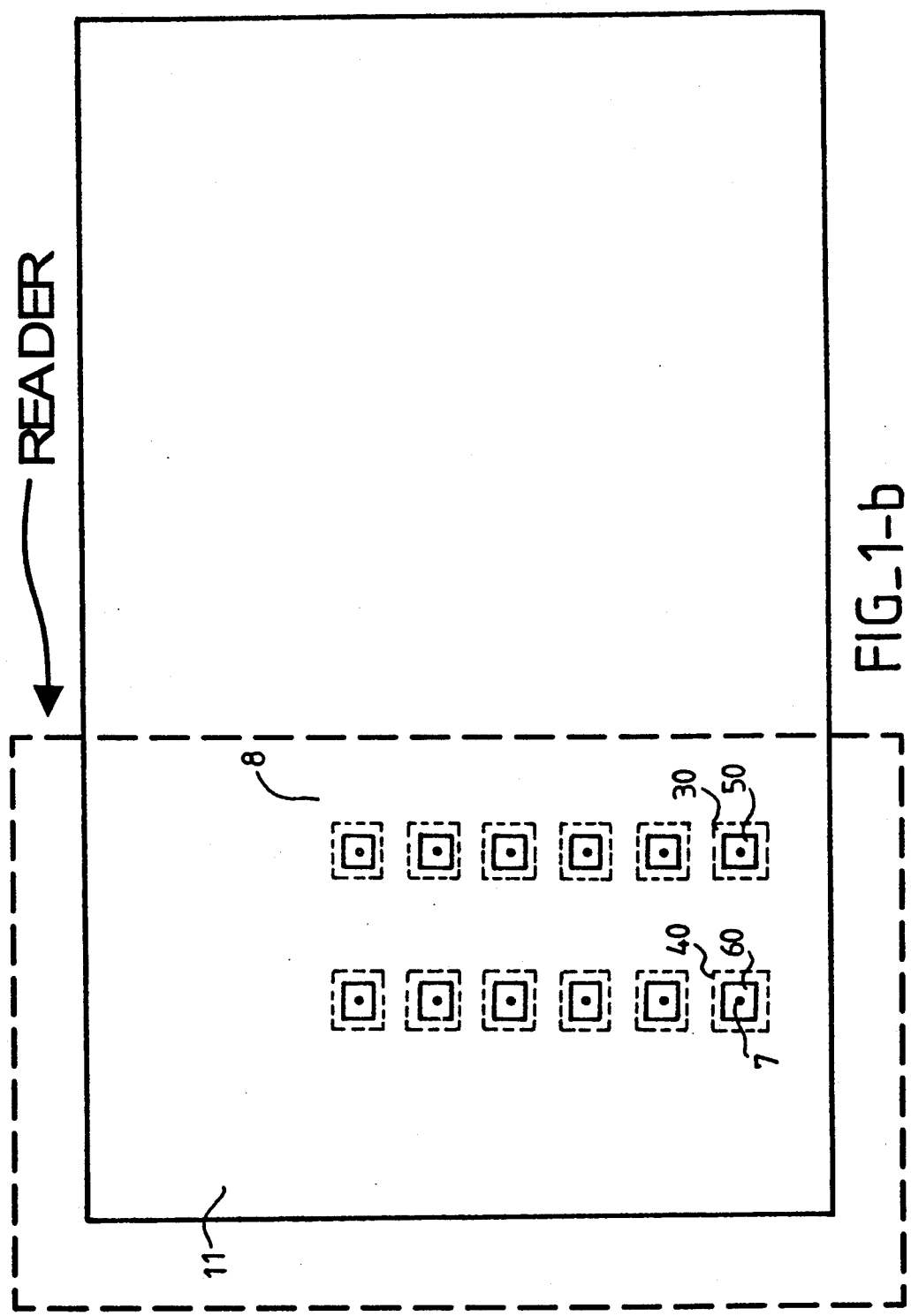

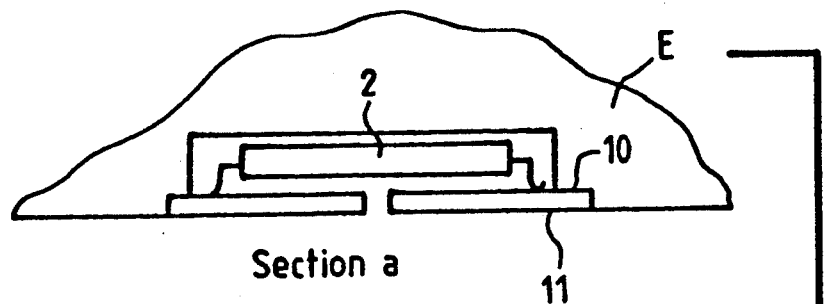
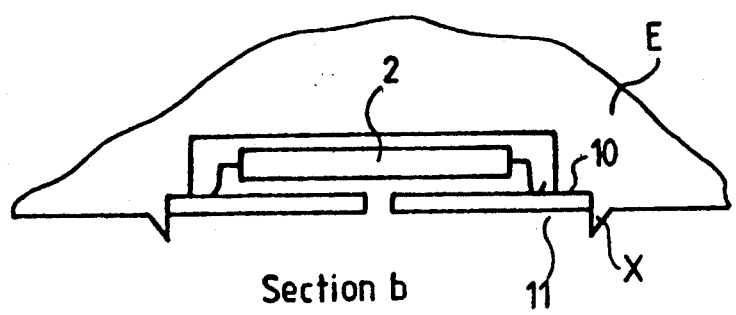
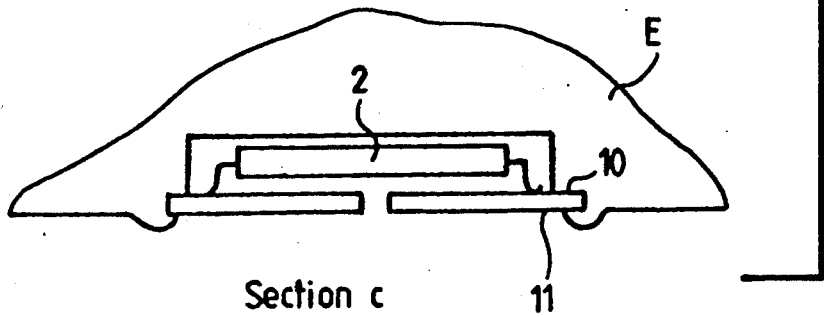
FIG_1-c

SMART CARD CHIP-BASED ELECTRONIC CIRCUIT

This application is a continuation of Ser. No. 07/598,063 filed on Oct. 16, 1990, abandoned.

BACKGROUND OF THE INVENTION

1. Field of the Invention

The present invention concerns a card having electronic circuits that can exchange data and which are known in the industry as "smart cards."

The various new uses of the smart card show that this card is destined to fulfill increasingly complex functions, if its field of application is to be extended. This entails, then, the need to use increasingly bigger surface areas of chips to be integrated into these cards in order to fulfill these functions. This is the case, for example, with two known applications of chip cards, namely the telephone card and the bank card. The chip of the telephone card is a simple memory. It takes up a surface area of the order of one mm$^2$. The chip of a bank card is a processor that integrates memory. It takes up a surface area of the order of 20 mm$^2$.

It may briefly be recalled that a chip card is a relatively slim plastic card, wherein a semiconductor chip and a grid of conductors are inset in the thickness of the card. The chip is mounted on an upper surface of the grid, for example by bonding. Conductive wires are then soldered, firstly, to output terminals of the chip and, secondly, to metallizations of the grid. This is the chip card mounting technology known as the chip on board technology. A lower surface of the grid is flush with one of the two surfaces of the card, and forms the connector of the chip card. When this card is inserted into the reader, it is to this connector that the reader gets connected.

However, the standard support of the chip card is ill-suited to a chip with a large surface area. While the support is flexible, the chip for its part is very rigid. The bigger the chip, the more sensitive it is to strains and the greater are the chances of its being damaged. In practice, the effect of this is to reduce the reliability of the chip card, when it integrates a big chip. This restricts the possibility of extending the range of uses of the chip card, notably to novel applications.

2. Description of the Prior Art

Various known techniques have been used to resolve this problem. It has been attempted, notably, to reduce the extent of the strains on the chip and the wires that connect it to its grid of connectors. We might cite, for example, the known use of a slab of cobalt placed beneath the substrate of the chip to rigidify the chip. In another example, the method for making a cavity in the card is modified so that the chip can be received in order to rigidify the environment of the chip. However, in this chip card mounting technology, these approaches do not enable mounting on large surfaces, with areas of more than 20 mm$^2$ for example. And, for surface areas such as this, numerous problems arise, notably the problem of the reliability of the chip thus mounted.

Besides, the plastic material that forms the card is not impervious to the various forms of ion and organic pollution to which the chips of the integrated circuit are very sensitive. The deterioration in reliability that is caused is all the more aggravated as the chip is big. This is a third technological limitation.

The mounting technology used is of the hybrid type. It is not optimized in terms of production. Indeed, semiconductor mounting technology uses a standard line for making a product in very large quantities. This product consists of one or more chips mounted in a standard package and called an electronic component. These chips may or may not be mutually interconnected. Beside these electronic components produced in large quantities, we therefore have a specific product, for example the chip card. Now this specific product is produced in far smaller quantities. And it too requires a specific production line. This considerably increases the production costs and depreciation costs of this line, as compared with those of production lines for standard products. Furthermore, the reject rate of this specific product is far higher than that of standard products because of the technology used. Indeed, the fixing of the wires is a delicate operation, the reliability of which directly affects the final product. These wires require specific protection to ensure that they do not deteriorate.

To circumvent these difficulties, it has also been attempted, in what is called "tape automatic bonding" technology, to connect metallization lead ends of the grid, particularly by hot transfer process, to the terminals of the chip. However, this technology also suffers from the degree of manufacturing precision that it requires. It too does not lead to sufficient reliability of mounting.

It is an object of the invention to overcome these drawbacks and enable the development of the chip card towards novel applications of greater complexity that are not hampered and restricted by the prior existence and use of magnetic cards, applications that might use, for example, an electronic key, in the sense of the electronic function and the shape of the object.

The invention uses conventional electronic packages provided with standard connection pins into which the function to be set up, comprising one or more chips conventional chips, is integrated. There is a known method of interconnecting several chips on a printed circuit and integrating the entire unit in a standard package. The reliability of the electronic component obtained is greater than that of the chips because the package mechanically shields the chip or chips of the electronic component from the various forms of ionic and organic pollution, and also because of the technology for mounting chips in a package, which is a standard technology that is well mastered. It is therefore possible to set up complex functions. However, a component such as this is not connectable as understood in the invention: for example, a component for surface mounting has pins that are too fine to provide for sure and reliable contact with the connector of a reader. A component mounted by insertion, for its part, may be inserted thousands of times in a connector: the pins will get bent or will even break and, in any case, the insertion operation is then a delicate one.

SUMMARY OF THE INVENTION

An object of the invention, therefore, is a system comprising an electronic component having output pins mounted by a surface-mounting operation on metal contacts of an upper surface of a connection means, wherein said system has a connector formed by metal contacts of a lower surface of the connection means, each of the metal contacts of the upper surface facing and being connected to one of the metal contacts of the lower surface, and vice versa.

BRIEF DESCRIPTION OF THE DRAWINGS

The characteristics of a system according to the invention are given in the following description, which is made with reference to the appended drawings. This description and these figures are given purely by way of indication and in no way restrict the scope of the invention. Of these figures:

FIG. 1a is a view in perspective of the upper part of a system according to the invention;

FIG. 1b is a top view of the lower part of a system according to the invention;

FIG. 1c shows three sectional views, a, b and c, of a connectable electronic module, made according to different encapsulation techniques.

DETAILED DESCRIPTION OF THE INVENTION

FIG. 1a shows a view in perspective of a system according to the invention. In the zone A, the connection system is formed by a connection means MC. In the example, this connection means includes an insulator support 1. An upper face 10 of the insulator support 1 includes a first row 3 and a second row 4 of metal contacts 30 and 40. The two rows 3 and 4 are parallel. The metal contacts 30 of the first row are aligned with the metal contacts 40 of the second row 4. The two rows 3 and 4 have one and the same number of metal contacts. The connection pitch P, which is the distance between the centers of two consecutive contacts 30 and 31, is the same for both rows in the example. The metal contacts 30 and 40 are plane and, for example, rectangular. An electronic component 2 is fixed to the upper face 10 of the insulator support 1 by means of a surface-mounting technology. Pins 20, 21 22 and 23 of the electronic component are placed at their free end on metal contacts (20, 22) or on the insulator support (21, 23). They are fixed, for example by hot soldering, to the metal contacts (pins 20, 22) and by bonding to the insulator support (pins 21, 23).

Facing each metal contact 30 and 40 of the upper face 10, there is a metal contact 50 and 60 on the lower surface 11 of the insulator support 1 (FIG. 1b). Two facing metal contacts, for example 40 and 60, are connected for example (in FIG. 1b) by a metallized hole 7.

The entire set of the metal contacts 50 and 60 of the lower surface 11 of the insulator support 1 constitutes the connector 8 of the system. The entire set of the metal contacts of each of the surfaces, namely the upper and lower surfaces, and the insulator support form the connection means MC in the example.

The metal contacts 50 and 60 of the lower face 11 are plane and, in the example, they are rectangular. In the example, each of these metal contacts 50 and 60 occupies a smaller surface area which is contained in the surface area occupied by the metal contact 30 and 40 corresponding to it on the upper face, i.e. the facing metal contact. The surface areas of the contacts could be equal in another example.

The practical making of a support 1 such as this, with metal contacts 30, 50 that correspond to each other on the upper surface 10 and lower surface 11 is, for example, as follows: holes 7 are drilled in an insulator support 1, at the positions of the future metal contacts 30, 40. Metal is applied to the two surfaces, namely the upper and lower surfaces, of the insulating support 1. This metal is etched by well-known methods to obtain the metal contacts 30 and 50. Since each hole 7 is included in each of the surface areas of the metal contacts that correspond to each other, namely 30 and 50, 40 and 60, it is metallized and provides for the connection between the two zones 30 and 50, 40 and 60. The insulator support may be, for example, a polyimide film or a printed circuit or any other insulator material.

The shape of the metal contacts 30 and 40 of the upper face 10 is dictated by the electronic component 2. We have said that the component is assembled by surface mounting on the support.

In a known way (as laid down by standards), for optimum mounting reliability in terms of manufacturing, the metal contacts 30 and 40 should be sufficiently wide. For, it should be possible to tolerate a component placed irregularly or slightly offset with respect to the metal contacts. This tolerance is related to the automatic mounting machines. There is also the minimum pitch that must be kept to in order to circumvent problems of electrical disturbance. This latter constraint also affects the shape of the contact zones 50 and 60. This shape should enable the maximum reliability of the contact with the connector of the reader.

Furthermore, there are several standards of packages for electronic components. An electronic function may therefore be proposed in different catalog packagings, for example as a package made of plastic or ceramic, with a square or rectangular shape, with pins in two rows or pins all along the rim of the package, a given connection pitch, pins curved inwards or outwards with respect to the package etc., and this list is not an exhaustive one.

Hence, on the upper face 10, a shape and a distribution of the connection zones 30 that are in accordance with the chosen type of packing (package) and connection (outputs of the package) is selected. In the example of FIG. 1a, the package is a rectangular one 24 with pins 26, numbering forty, distributed in two rows.

The choice of a surface-mounted component is related to the use of the connector 8 of the system. It may be recalled that the connector 8 is formed by metal contacts 50 and 60 of the lower face 11 of the insulator support 1 (FIG. 1b). If an electronic component mounted by insertion is used, the pins of this support cross the support 1 and go beyond the lower face of the support: the drawbacks that this entails can be seen at once. Firstly, they can be perceived by the touch, since the lower surface is sprinkled with ends of the pins. Secondly, there are drawbacks as regards insertion and connection in a reader of the system. In the rest of the description, when we speak of electronic components, we refer implicitly to surface mounted components.

It has been seen, therefore, that there are connection zones corresponding to standard surface-mounted electronic components. The shape of these connection zones may vary: it may be round, rectangular, etc. But their number and distribution are well known, depending on the type of package chosen and, therefore, on its connection: herein the connection is adapted to the electronic circuitry.

However, there are also connectors, standardized or not, such as chip cards, that do not correspond to the standards laid down by the standard packagings and connection systems of the electronic components. This is because these connectors have not been defined for such components. These connectors are defined for the reader of the portable and connectable system. They are defined in terms of the shape, number and distribution of the connection zones, their positioning in the reader etc. It is therefore important to be able to use these readers, because they exist. In such cases, the electronic circuit will be matched with the connection.

A good example of an existing reader is the reader of a chip card, of the public phone type. The well-known connector of a chip card is standardized: the connection pitch is 2.54 mm, it has two rows of four metal contacts; the rows are spaced out by about 8 mm. This connector is on the lower face of the support. On the upper face, there are corresponding and facing metal contacts. However, the shape of each zone of the upper face may be different from that of the metal contacts of the connector: it may be wider for example.

A known standard for electronic components defines a connection pitch of 1.27 mm. If this standard is chosen with a 16-pin package, wherein one in every two pins is connected to the electronic function integrated into the package, it is seen that the connection pitch of the pins connected to the electronic function becomes 2.54 mm: it is possible to mount a component such as this on a support, the connector of which is that of a chip card. The pins that are not connected to the electronic function are then used for the mechanical holding of the electronic component in its support.

To match the width of the package and the shape of the pins with the connection zones of the upper face of the support, it is enough, for example, to make metal contacts that are wider towards the interior of the two rows for a narrow package or for packages curved beneath the package. For a wide package or for pins curved towards the exterior of the package, the opposite arrangement is made for example: contacts that are wider towards the exterior of the rows, which will go beyond the package.

This example is slightly different from the one that we have chosen to describe with reference to FIG. 1a. In effect, in the example of FIG. 1a, we have shown an electronic component 2 wherein only one pin 20 in three successive pins 20, 21 and 22 is connected to the electronic function integrated into the package. This is done to show the various possibilities of the matching of a mounting of an electronic component with a given type of connector, according to the invention.

In this example, the component 2 is mounted on the support so that each of the output pins of the electronic functions integrated into the package 24 is fixed to a metal contact 30 of the upper face 10. It is clear that the number of electronic output pins is smaller than or equal to the number of metal contacts. In the example, there are two pins 20, 22 fixed to the same conductive zone. But only one pin, 20, is an electronic output. Between each successive metal contact, a pin of the package is fixed to the insulator support. This arrangement is deduced from the ratio between the connection pitch of the connector and that of the component.

In the example, the package is longer than the connection surface on the support. This is why the pins 23 outside the connection zone are, in the example, fixed to the insulator support. In the example, the connection zone comprises all the metal contacts on one and the same surface.

It will be recalled that the pins 21, 22 and 23 herein have only one function of mechanically holding the electronic component 2 on its support, as was stated in the description. It is clear that the pins, which are electronic outputs, preferably face each other on the two rows 3 and 4, like the pins 20 and 27 in FIG. 1a.

It is therefore seen that it is possible, in this way, to use any standard package of surface-mounted electronic components, the number of pins of the package and the type of the package being determined, firstly, by the complexity of the electronic function or functions to be integrated, secondly by the number of outputs of these functions and the type of connector 8 of the system.

It is thus possible to set up a complex electronic function having a small number of outputs, by chips integrated into packages that shield them mechanically and very substantially improve the reliability of the electronic function. Certain pins may be used only for the mechanical holding of the standard electronic component, thus made, on its support.

Advantageously, according to a second embodiment shown in a cross-sectional view in FIG. 1c, the connection means has only metal contacts: the metal contacts 30, 50 that faced each other and were connected in the previous example are now merged: they are used, on the upper surface 10 side of the connection means MC, for interconnection with the surface-mounted component 2, and on the lower surface (11) side as as a connector (8). In this case, there is no longer even any insulator support. This is possible, for the component is solid and rigid, and there is no risk of pollution. The component, then, can be mounted on a grid of components short-circuited with one another, and then these contacts may be cut out. This operation is simple and reliable. The metal contacts may be designed to be thick enough to increase the rigidity of the module. It is always possible to deposit the insulator on the pins or beneath the component although that is no longer obligatory in this embodiment of a connectable component. As in the first embodiment, it is possible for pins not to be connected: they are not electronic outputs of the component. They play a purely mechanical role. They then facilitate the catching, for example, of a previously molded plastic material which encapsulates the connectable component. These pins can also be mounted on a metal contact. For example, there may be two pins on one and the same contact: only one of the pins is an electronic output in this case, but the two pins increase the rigidity of the connection.

FIG. 1c shows an encapsulation E of the electronic component 2 made connectable according to the invention. This encapsulation may be formed by a dielectric material, which is a dissipating or a conductive material. Should it be conductive, there should be provision, for example, for an insulator in the cavity that has to contain the component. The component may very well be on a level with the external surface of the encapsulating material which may be of any suitable material, the only constraint being that the connector (8) should be accessible by a reader. The encapsulation may be, for example, bonded (section a) or again it may be soldered by ultrasonic soldering. In the latter case, the encapsulation has excess material x (section b), at the contacts. This enables the encapsulation to be caught on the contacts by ultrasound: the coating is riveted (section c). This latter approach is especially valuable in the case of an encapsulation with dissipative material (i.e. a material with low conductivity); the contacts and the encapsulation are on one and the same equipotential surface, and this further allows the absorption of the electrostatic charges emitted close to the contacts. The dissipative character of the encapsulation also enables the normal functioning of the component: the contacts are then no longer short-circuited. We can see the value of an encapsulation such as this which enables both the normal functioning of the circuit and electrostatic shielding.

It is also possible to have another electronic part linked to the one that has just been described. An example such as this is shown in the zone B of FIG. 1a.

In FIG. 1a, the metal contacts 30 and 40 of the upper face 10 of the support 1 are extended by conductive wires 300 and 400 towards the zone B. Preferably, the conductive wires 300 and 400 do not go beneath the package 24 of the electronic component 2. In the zone B, they form a connection zone in the support 9. In the example, the zone B is a multilayer zone: it consists of several stacked and mutually interconnected connection layers 900. On the upper surface 90, electronic components 92 and 93 are surface mounted on standard metal contacts 94. These components 92 and 93 are, for example, interconnected by the connection layers 900 of the support 9. They are also interconnected with the electronic component 2 by the connection layer 901 bearing the conductive wires 300, 400 which extend the metal contacts 30 and 40.

The electronic components 92 and 93 herein are compatible with a surface mounting operation. They could also quite well be components mounted by insertion. Indeed, in the example, these components do not have to be connected in the sense of the invention. Of course, they could be so if it is desired to have, in one and the same system, several electronic functions that are independent of one another, each being connectable in the sense of the invention.

The connection zones are standard zones as compared with the type of electronic components 92 and 93 since no external constraint has to be taken into account. It would be quite possible to mount the components 92 and 93 on the lower surface 91 or even on both surfaces, namely the lower surface 91 and the upper surface 90, of the support 9. It is therefore seen that a wide variety of combinations is possible. For example, the lower surface 11 and the lower surface 91 may be the same.

The support 9 may be formed by only one connection layer which then has only the conductive wires 300 and 400: the support 9 may then quite simply be the support 1.

In the zone A, the conductive wires 300, 400 are, in the example, on the upper surface 10 of the support 1. They could be in a median plane, i.e. parallel and included between the lower face 11 and upper face 10 of the support 1.

What remains to be done is to encapsulate the system in a material. The system may have any shape, matching the reader. The only constraints, therefore, are:

First of all, if the system is not completely inserted into the reader, the non-inserted part should not have any electrical connections that are not electrically insulated. For, otherwise there would be electrical disturbances that would damage the working of the system.

Then, the connector should be flush with a surface of the system so that the reader can be connected to the top.

Furthermore, the shape of the system should enable easy insertion, whether partial or total, and a reliable connection of the reader to the system.

Finally, if the encapsulating material is not a dielectric, there should be provision for insulating the entire connection with encapsulating material.

A well-known possible shape is that of a card. It could also be a key shape or any other shape, provided that it meets the criteria stated above.

In the system described, the reliability of the electronic system is considerably improved as compared with that obtained with the standard technology of chip cards. Indeed a package, for example one made of plastic or ceramic, of an electronic component is rigid. It is also impervious, notably to the various forms of ionic and organic attack. It is the package that improves reliability. In conclusion, in the invention, we thereby obtain sufficient reliability to achieve complex applications in the field of connectable and portable electronic systems, especially banking applications. This could not be contemplated with the standard technology of the chip card for reasons already explained.

The choice of the type of package is also varied. What is important is the optimization of the cost of manufacturing the module, depending on the density of integration necessary for the application in view, the manufacturing cost and the reject rate in each of the various technologies.

Indeed the manufacturing cost aspect is very important in the field of chip cards. For, the aim of the users is to have a very low purchase price. For this reason, as we have already seen, the production and depreciation costs caused by the use of a specific production line in standard chip card technology is a major drawback of this technology as regards the manufacturing cost aspect. In addition to this factor, there is the high reject rate, a rate that is higher than the one obtained with the standard technology of semiconductors. The use of electronic components overcomes all these drawbacks. In effect, the production lines are then standard semiconductor mounting lines. Moreover, when the electronic components are mounted, for example on a printed circuit, if they fail the final test, a component that may be defective can be unsoldered and replaced by another one. A printed circuit that may be defective can also be changed and the component can thus be kept: the module is not lost in its entirety. This represents a clear advantage over the chip card: if the chip card is defective, nothing can be recovered from it.

In short, the invention therefore makes it possible to have a portable and connectable electronic system suited to every complex and novel application. In particular, the scope of the invention covers any electronic system, having at least one surface-mounted component connected or not connected to another electronic circuit of the system and connectable in the sense of the invention, that is surface mounted:

- either on metal contacts on the surface of an insulating support, these contacts facing each other and being connected to other metal contacts of the opposite surface on the insulating surface which form the connector;
- or advantageously on metal plates forming the interconnection with the component on one side and forming the connector on the other side, namely the opposite side.

The invention considerably improves the reliability of the electronic part of a system. It reduces manufacturing costs and depreciation costs by providing a standard technology electronic circuit wherein only the application is specific, as compared with the conventional chip card wherein the electronic circuit is specific both in its application and its manufacturing technology.

What is claimed is:

1. A smart card comprising:
   an insulative support member for supporting an electronic circuit and for rigidifying said card;
   at least one standard semiconductor package supported on a first side of said support member and having a plurality of leads connected thereto, some of said leads being electrically connected to a semiconductor circuit in said semiconductor package, others of said leads providing support for said package but not being electrically connected to said semiconductor circuit;
   first contact areas on a first surface of said insulative member connected to said leads which are electrically connected to a semiconductor circuit and not connected to said other leads providing support; and,
   second contact areas on an opposite side of said insulative member in alignment with said first contact areas, said second contact areas being electrically connected to said first contact areas, and being exposed on said second side in a predetermined configuration for contacting electrical contact areas of a card reader;
   at least one of said contact areas being contacted by multiple adjacent ones of said leads.

2. The card set forth in claim 1, wherein said insulative member is an insulator support circuit board having said first and second contact areas formed on the upper and lower surfaces thereof.

3. The card set forth in claim 2 wherein said insulator board has metallized through holes formed between corresponding first and second contact areas.

4. The card set forth in claim 2 together with a stack of multilayered interconnected circuit boards having semiconductor packages connected thereto, the first contact areas of the card being extended to a circuit board of the stack thereby interconnecting all of the semiconductor packages of a resultant enlarged card.

5. The card set forth in claim 1 wherein said insulative member is a mass of encapsulation material which encapsulates the package and its leads as well as the first contact areas;
   said second contact areas having outer surfaces free of encapsulation material for allowing connection to contacts of a card reader;
   corresponding ones of said first and second contact areas each being part of a single metallic member.

6. The card set forth in claim 5 wherein said mass of encapsulation material is riveted to clamp an exposed edge of each single metallic member to the mass of the encapsulation material.

7. The card set forth in claim 5 together with a stack of multilayered interconnected circuit boards having semiconductor packages connected thereto, the first contact areas of the card being extended to a circuit board of the stack thereby interconnecting all of the semiconductor packages of a resultant enlarged card.

8. The card of claim 1, wherein said package has a footprint of more than 20 square millimeters.

9. The card of claim 1, further comprising encapsulating material which laterally surrounds said package.

10. The card of claim 1, wherein the number of active signal connections of said semiconductor circuit is less than half of the number of said leads of said package.

11. A smart card comprising:
    a card substrate predominantly comprising an insulating material;
    conductive traces on at least one surface of said substrate;
    a programmable integrated circuit chip having first and second power supply connections, and one or more active signal connections;
    a standard integrated circuit package containing said chip, and having multiple leads at the periphery thereof;
    wherein at least a first one of said leads is affixed to a respective one of said traces and is operatively connected to one of said active signal connections of said chip, and
    wherein at least a second one of said leads is affixed to a respective one of said traces and is NOT operatively connected to any of said active signal connections of said chip, and
    wherein at least a third one of said leads is affixed directly to said substrate.

12. The card of claim 11, wherein said package has a length which is greater than the width across all of said traces.

13. The card of claim 11, wherein said package has a footprint of more than 20 square millimeters.

14. The card of claim 11, further comprising encapsulating material which laterally surrounds said package.

15. The card of claim 11, wherein said traces are spaced in a pattern corresponding to external through-hole contact locations.

16. The card of claim 11, wherein at least some of said leads are arranged in a regular repeating patter of lead-on-trace, lead-on-trace, lead-on-substrate, etc.

17. The card of claim 11, wherein the number of said active signal connections on said chip is less than half of the number of said leads of said package.

18. A smart card comprising:
    a card substrate predominantly comprising an insulating material;
    conductive traces on at least one surface of said substrate;
    a programmable integrated circuit chip having first and second power supply connections, and one or more active signal connections;
    substantially flat standard integrated circuit package containing said chip, and having multiple leads at the periphery thereof;
    wherein each of a first plurality of said leads is affixed to a respective one of said traces and is operatively connected to a respective one of said active signal connections of said chip, and
    wherein each of a second plurality of said leads is affixed to a respective one of said traces and is NOT operatively connected to any of said active signal connections of said chip, and
    wherein each of a third plurality of said leads is affixed directly to said substrate.

19. The card of claim 18, wherein said package has a length which is greater than the width across all of said traces.

20. The card of claim 18, wherein said package has a footprint of more than 20 square millimeters.

21. The card of claim 18, further comprising encapsulating material which laterally surrounds said package.

22. The card of claim 18, wherein said traces are spaced in a pattern corresponding to external through-hole contact locations.

23. The card of claim 18, wherein at least some of said leads are arranged in a regular repeating pattern of lead-on-trace, lead-on-trace, lead-on-substrate, etc.

24. The card of claim 18, wherein the number of said active signal connections on said chip is less than half of the number of said leads of said package.

25. A smart card comprising:
a card substrate predominantly comprising an insulating material;
conductive traces on at least one surface of said substrate;
a programmable integrated circuit chip having first and second power supply connections, and one or more active signal connections;
a standard surface-mount integrated circuit package containing said chip, and having multiple leads at the periphery thereof;
wherein multiple ones of said traces each have two of said leads affixed thereto;
and wherein at least one of said leads is affixed directly to said substrate and not to any of said traces.

26. The card of claim 25, wherein said package has a length which is greater than the width across all of said traces.

27. The card of claim 25, wherein said package has footprint of more than 20 square millimeters.

28. The card of claim 25, further comprising encapsulating material which laterally surrounds said package.

29. The card of claim 25, wherein said traces are spaced in a pattern corresponding to external through-hole contact locations.

30. The card of claim 25, wherein at least some of said leads are arranged in a regular repeating pattern of lead-on-trace, lead-on-trace, lead-on-substrate, etc.

31. The card of claim 25, wherein the number of said active signal connections on said chip is less than half of the number of said leads of said package.

32. A smart card comprising:
a programmable integrated circuit chip having first and second power supply connections, and one or more active signal connections;
a standard surface-mount integrated circuit package containing said chip, and having multiple leads at the periphery thereof;
a plurality of metal plates, each having at least tow of said leads affixed thereto, and each having a back surface partially exposed for electrical contact;
and wherein a plurality of said leads are not affixed to any of said traces.

33. The card of claim 32, wherein said package has a footprint of more than 20 square millimeters.

34. The card of claim 32, further comprising encapsulating material which laterally surrounds said package.

* * * * *